United States Patent [19]
Copp

[11] Patent Number: 5,972,150
[45] Date of Patent: Oct. 26, 1999

[54] LAMINATION STABILIZER BLOCK

[76] Inventor: John B. Copp, 1208 Luanne, Fullerton, Calif. 92631

[21] Appl. No.: 09/063,489

[22] Filed: Apr. 20, 1998

[51] Int. Cl.[6] .................................................... B30B 15/00
[52] U.S. Cl. ........................................... 156/228; 156/580
[58] Field of Search ................................. 156/228, 580, 156/581, 583.1, 583.3; 100/214, 295, 315

[56] References Cited

U.S. PATENT DOCUMENTS

| | | | |
|---|---|---|---|
| 4,032,387 | 6/1977 | Sugiyama et al. | 156/497 |
| 5,098,508 | 3/1992 | Mattil | 156/363 |
| 5,468,315 | 11/1995 | Okada et al. | 156/64 |
| 5,788,808 | 8/1998 | Natarajan et al. | 156/580 |
| 5,814,185 | 9/1998 | Chun et al. | 156/580 |

Primary Examiner—James Sells
Attorney, Agent, or Firm—Knobbe, Martens, Olson & Bear, LLP.

[57] ABSTRACT

Disclosed is a stabilizer block for stabilizing the position of a lamination book when being compressed between the platens of a lamination press. The stabilizer block includes a slide member that is slidably positioned within an outer housing so that the height of the stabilizer block reduces in response to pressure. A plurality of magnets are positioned within the stabilizer block to secure the stabilizer block to a carrier tray. In use, one or more stabilizer blocks are positioned around the periphery of the lamination book to act as walls that prevent the layers in the lamination book from undesirably moving when the lamination book is being pressed.

17 Claims, 9 Drawing Sheets

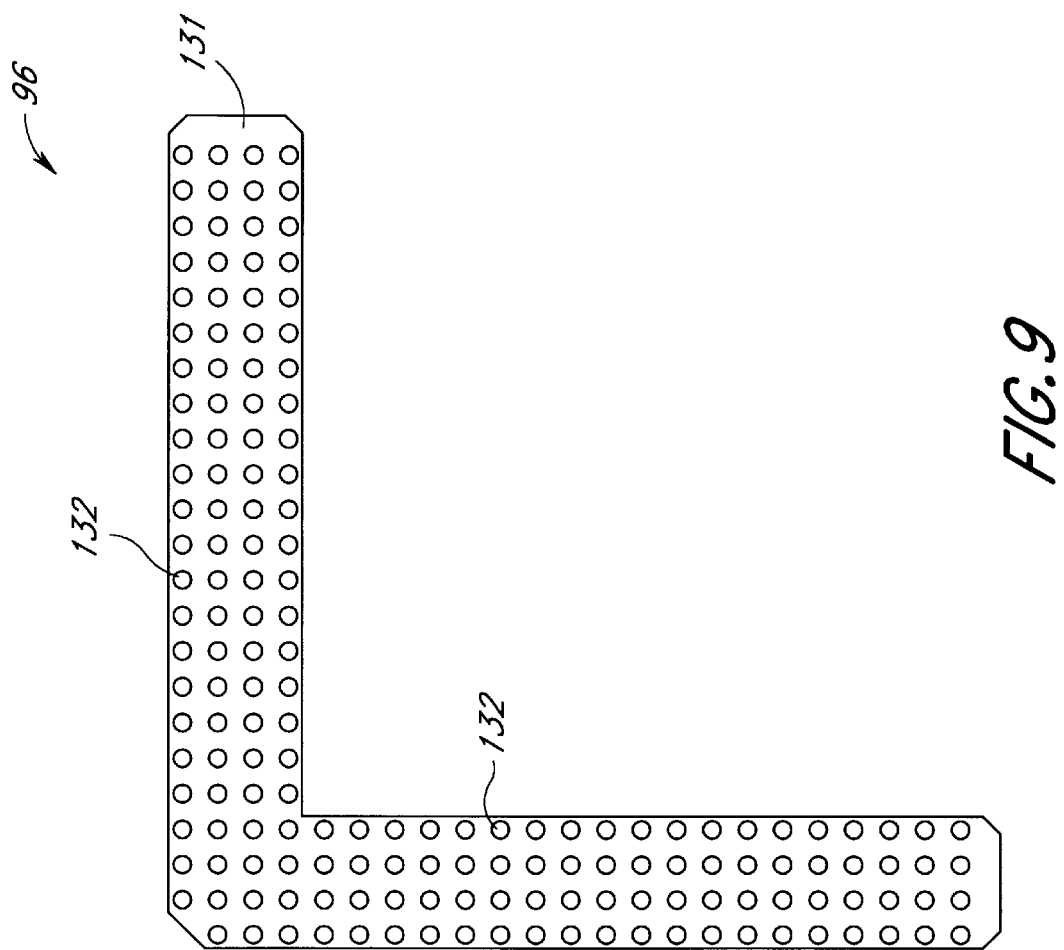

LAMINATION STABILIZER BLOCK

BACKGROUND OF THE INVENTION

1. Field of the Invention

The present invention relates to a stabilizer block used in the manufacture of laminated objects. More particularly, the present invention relates to a device used to stabilize the position of layers in a laminate structure when being compressed between the platens of a lamination press.

2. Description of the Related Art

A printed circuit board is an insulated board or panel upon which a plurality of interconnected electronic circuits are mounted. The manufacturing of both single layer and multilayer circuit boards typically involves using a press to laminate together a plurality of thin layers of material, such as prepreg, copper and/or inner-layer circuit boards, between a pair of metallic plates. Typically, the plurality of layers are stacked atop each other and placed between a pair of protective plates or cauls to form a "lamination book". The lamination book is placed on a carrier tray which is positioned between the platens of a lamination press. The platens are then heated and moved toward one another to compress the lamination book therebetween at a high pressure, such as 100–800 psi.

Unfortunately, the are several difficulties associated with the process of compressing the lamination book within the lamination press. One such difficulty is that the layers in the book tend to move or shift as the platens apply pressure. As heat and pressure are applied, the prepreg melts and becomes less viscous, which often causes the layers to slide relative to one other. Such sliding may undesirably interfere with the correct alignment of the layers of the lamination book relative to the other layers. Additionally, abnormalities in the surfaces of the layers sometimes cause the pressure to be applied unevenly across the surface of the layers. This uneven pressure distribution may build and cause one or more of the layers to dangerously shoot out of the press as pressure is being applied.

In order to avoid such mishaps, the pressure and heat is often increased at a slow and gradual rate to thereby reduce the likelihood of the layers laterally shifting from their desired locations. The slow increase in pressure allows the layers to settle gradually and thus avoid shifting or movement. Unfortunately, a gradual increase in heat and pressure lowers the efficiency of the manufacturing process by increasing the amount of time required to manufacture the laminate structure.

To overcome this problem, some circuit board manufacturers use stabilizer blocks to prevent the layers in the lamination book from shifting during the pressing process. The stabilizer blocks typically comprise a set of blocks having abutment surfaces on one side. The stabilizer blocks are typically positioned on the carrier tray with the abutment surfaces of the blocks positioned around the perimeter of the lamination book to prevent the layers in the book from moving. The blocks are typically mounted with the abutment surface positioned adjacent an edge of the book on pins that are fixedly attached to a set of pin holes in the carrier tray. The coupling of the stabilizer blocks to the pins prevents the stabilizer blocks from moving relative to the carrier tray. However, the pins must be precisely positioned on the carrier tray or else the book may not fit correctly between the blocks once the blocks are mounted to the pins. Moreover, the book must also be precisely positioned relative to the stabilizer blocks. The requirement for such precise positioning of the book reduces manufacturing efficiency. Further, new pin holes may have to be drilled to accommodate different sized books.

Another disadvantage of current stabilizer blocks is that the abutment surfaces of the blocks are generally not configured to compress within the press. The abutment surfaces thus generally have a height that is less than the height of the lamination book so that the stabilizer block will not absorb forces from the platens as they are compressing the book. Because the abutment surface is shorter than the height of the lamination book, there is a likelihood that the uppermost layer in the lamination book might move laterally over the top of the stabilizer block as the book is being compressed.

There is therefore a need for an improved stabilizer block that secures the position of a lamination book during pressing. The stabilizer block should be configured to fit within a press and not interfere with the application of pressure onto the lamination book. Additionally, the stabilizer block should be capable of being easily and quickly positioned on a carrier tray around the perimeter of the lamination book and readily adjustable to accommodate different-sized books.

SUMMARY OF THE INVENTION

The aforementioned needs are satisfied by the present invention, which relates to a stabilizer block for securing a lamination book against undesired movement during the lamination process. The stabilizer block defines an abutment surface that is configured to be positioned around the perimeter of the lamination book to act as a wall to prevent the lamination book from moving when being compressed in a lamination press and dislodged or moved during transport to the press or racks.

In one embodiment, the stabilizer block comprises an outer housing and a slide block slidably mounted therein. A plurality of springs are mounted between the outer housing and the slide block to bias the slide block outward relative to the outer housing. When biased as such, the stabilizer block has a first height that may be reduced to a second height by compressing the springs so as to slide the slide block into the outer housing. Advantageously, the stabilizer block reduces in height with the lamination book as the lamination press applies pressure thereto moving the resin.

A plurality of magnets are preferably mounted in the slide member so as to extend through the bottom surface of the stabilizer block. When the bottom surface of the stabilizer block is positioned on a metallic support surface, the magnets create a magnetic force between the stabilizer block and the support surface so as to inhibit the stabilizer block from moving relative to the support surface. In a preferred embodiment, a pair of pads are positioned on the top and bottom surfaces of the stabilizer blocks. The pads are desirably manufactured of a skid resistant and heat resistant material that further inhibits the stabilizer block from sliding or moving on a surface.

In one aspect of the invention, there is disclosed a stabilizer block for stabilizing the position of a laminar stack having a plurality of layers positioned on top of each other in a desired lateral orientation, the stack being positioned on a support surface between a pair of platens of a lamination press so that the stack can be compressed into a laminar structure. The stabilizer block comprises a first member and a second member coupled to the first member so that the first and second members are movable with respect to one another in a first direction. The first and second member are movable between a first and a second position so that the stabilizer block compresses in height in response to a force being applied to the stabilizer block along the first direction. A biasing member is coupled to the first member and the second member so as to urge the first member and the second member away from each other.

Additionally, an abutment surface is defined by the first member and the second member, the abutment surface being substantially planar so as to be positioned adjacent an edge of the laminar stack without catching a separator plate or any other layer of the lamination stack. Desirably, the abutment surface has a first height greater than the height of the laminar stack when the first and second members are in the first position. The abutment surface also has a second height which is less than the height of the laminar stack, while still remaining substantially planar, when the first and second members are in the second position so that the laminar stack can be compressed by the platens of the laminar press while the abutment surface is in contact with the layers of the laminar stack so as to retain the layers in the desired lateral orientation during compression of the stack.

In another aspect of the invention, there is disclosed a method of manufacturing a laminated structure. The method comprises forming a lamination book by stacking a plurality of layers of laminar material atop one another, wherein the peripheral edges of at least one of the laminar layers defines a perimeter of the book. The method further comprises placing the book on a first planar surface and positioning at least one stabilizer block on the first planar surface so that an abutment surface of the stabilizer block defines a boundary line positioned adjacent at least a portion of the perimeter of the book. The stabilizer block has a height that is greater than the height of the lamination book. The method additionally comprises stabilizing the position of the stabilizer block relative to the first planar surface by using a magnet to couple a bottom surface of the stabilizer block to the first planar surface and compressing the book between the first planar surface and a second planar surface so that the stabilizer block compresses in height. The abutment surface of the stabilizer block prohibits the adjacent portion of the perimeter of the lamination from book moving across the boundary defined by the abutment surface.

The magnets of the stabilizer block advantageously allow the stabilizer block to be fixedly positioned on a support surface and stabilize the position of an adjacent lamination book without the use of stabilizer pins. The stabilizer block may thus be quickly and easily positioned around lamination books of various shapes and sized. The stabilizer block reduces in height as pressure is applied by a lamination press so as not to interfere with pressure being applied to the lamination book and also prevent movement of the lamination on stack during transportation.

BRIEF DESCRIPTION OF THE DRAWINGS

These and other features of the invention will now be described with reference to the drawings of a preferred embodiment, which are intended to illustrate and not to limit the invention, and in which:

FIG. 9 is a top plan view of a top pad of the stabilizer block of FIG. 3.

DETAILED DESCRIPTION OF THE PREFERRED EMBODIMENT

Figure 1:
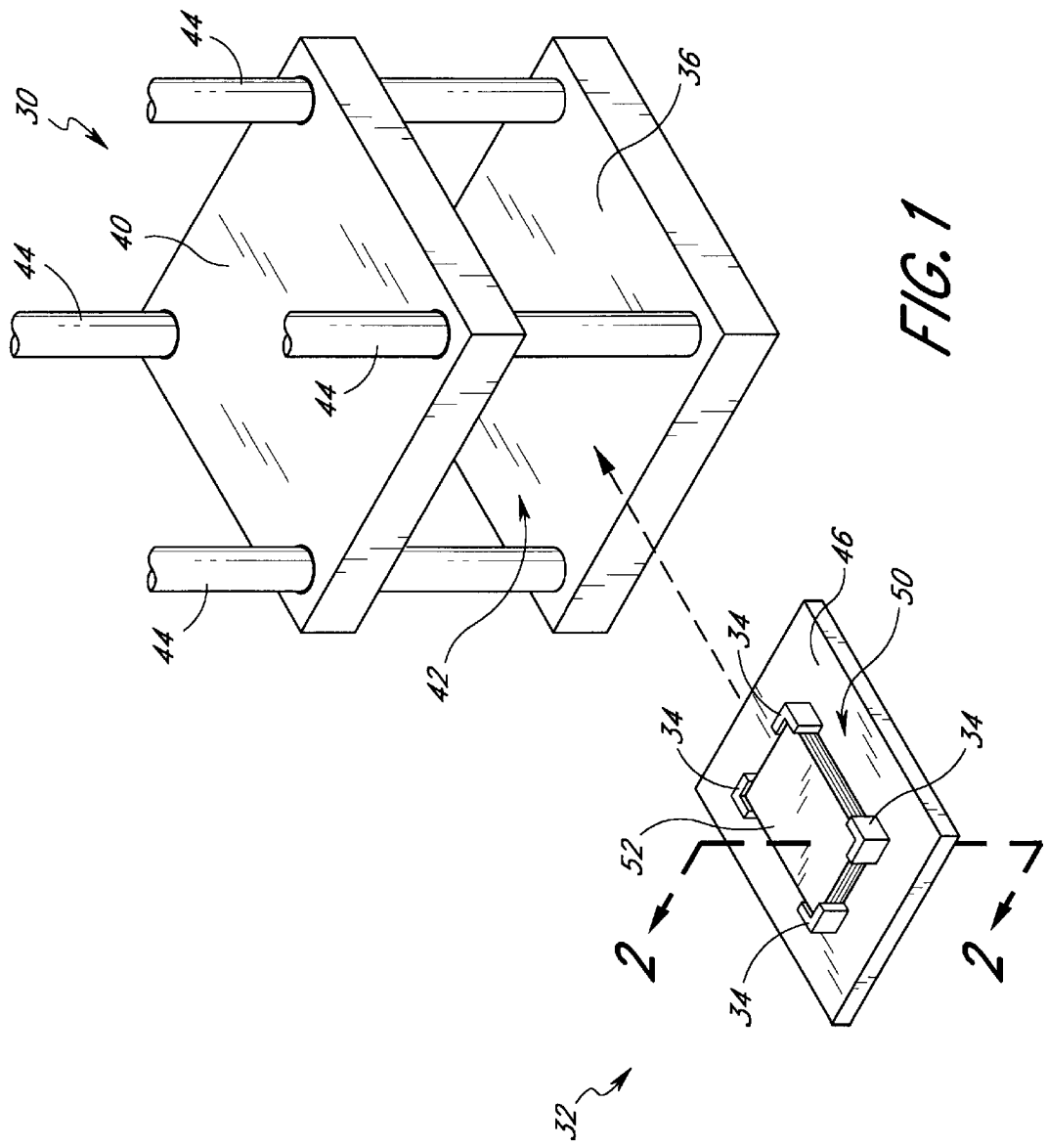
FIG. 1 schematically illustrates a lamination press and a circuit board lamination assembly including one embodiment of a stabilizer block of the present invention.

Reference will now be made to the drawings wherein like numerals refer to like parts throughout. FIG. 1 schematically illustrates a lamination press 30 configured to receive and compress therein a circuit board lamination assembly 32. The lamination assembly 32 includes a set of stabilizer blocks 34 that advantageously stabilize components of the circuit board lamination assembly 32 against undesired movement within the lamination press 30 during a pressing process, as described in more detail below.

In the illustrated embodiment, the lamination press 30 includes a substantially planar first or bottom platen 36 and a substantially planar second or upper platen 40 aligned substantially parallel to the first platen 36. The first platen 36 and second platen 40 define a lamination space 42 therebetween that is sized to receive the circuit board lamination assembly 32. The first platen 36 and second platen 40 are movably mounted in well-known manner to a set of cylindrical pistons 44. The first and second platens 36, 40 are configured to travel toward one another other in a direction parallel to the axis of the pistons 44 to compress an object positioned within the lamination space 42. Although the lamination press 30 is described herein with only two platens 36, 40, it will be appreciated that the number and arrangement of the platens on the lamination press 30 may be varied. Furthermore, the stabilizer blocks 34 can be used in conjunction with multiple configurations of lamination presses 30 known in the art without departing from the spirit of the present invention.

With reference to FIG. 1, the circuit board lamination assembly 32 includes a planar carrier tray 46 defining a substantially flat support surface 50 thereon. The carrier tray 46 is sized to fit entirely within the lamination space 42 atop the first platen 36. The circuit board lamination assembly 32 further includes a lamination book 52 positioned on the carrier tray support surface 50. The lamination book 52 comprises a plurality of flat laminar layers that are stacked atop one another, as described in more detail below. As mentioned, the circuit board lamination assembly 32 also includes the plurality of stabilizer blocks 34 that are positioned on the support surface 50 around the periphery of the lamination book 52. The stabilizer blocks 34 function to secure the lamination book 52 against undesired lateral movement in a direction parallel or substantially parallel to the support surface 50, as described more fully below.

Figure 2:
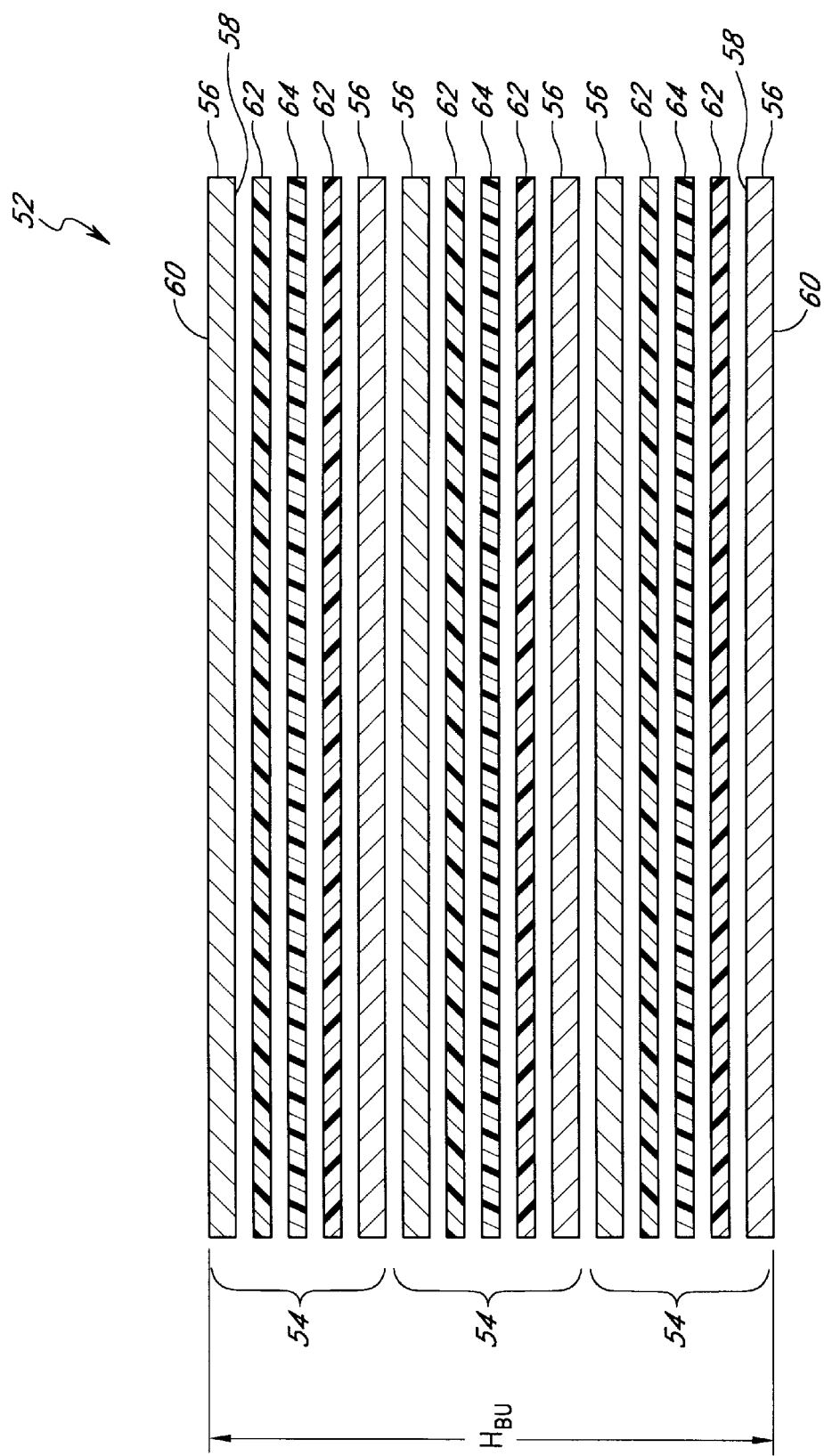
FIG. 2 is a cross-sectional view of a lamination book of the circuit board lamination assembly of FIG. 1 taken along the line 2—2.

FIG. 2 is a cross-sectional view of the lamination book 52 taken along line 2 of FIG. 1. The lamination book 52 includes any number of stacked sub-books 54 which each comprise a plurality of stacked layers of planar laminates. In the illustrated embodiment, each sub-book 54 includes a pair of flat outer plates or cauls 56 that are positioned on the top and bottom of each of the sub-books 54. Each caul 56 has a flat inner surface 58 and a flat outer surface 60. A peripheral layer 62 of thin laminate material is positioned adjacent the inner surface 58 of each of the cauls 56. At least one intermediate layer 64 of planar laminate material is interposed between the peripheral layers 62 of each sub-book 54. As described in more detail below, the lamination book 52 may be heated and compressed within the lamination press 30 to form a laminated structure, such as a multi-layer circuit board or a copper-clad laminate. It will be appreciated that the number and arrangement of the various layers in each sub-book 54 may vary widely and that the number of sub-books 54 in the lamination book 52 may also vary depending on the laminated structure that is to be manufactured.

With reference to FIG. 2, the lamination book 52 has an un-laminated height $H_{BU}$, which is the height of the lamination book 52 prior to being heated and compressed within the lamination press 30. The lamination book 52 has a laminated height $H_{BL}$ (FIG. 8B) after being heated and compressed. The laminated height $H_{BL}$ of the lamination book 52 is less than the un-laminated height $H_{BU}$ of the lamination book 52. As used herein, the "height" of the lamination book 52 is the distance between the outer surfaces 60 of the top-most and bottom-most cauls 56 of the lamination book 52. It will be appreciated that the gaps between the layers in FIG. 2 are depicted only for clarity and that, in use, the layers of the lamination book 52 are positioned immediately adjacent so as to contact one another.

The cauls 56 are desirably manufactured of a material that is configured to withstand high temperatures and pressures, such as stainless steel or other material as required. The peripheral layers 62 and intermediate layers 64 may comprise various materials depending on the laminated structure that is to be manufactured. For example, for manufacturing a copper-clad laminate, the peripheral layers 62 could each comprise a thin sheet of the copper material and the intermediate layer or layers 64 could comprise an insulation material that melts at high temperatures, such as prepreg material, as known to those skilled in the art. For manufacturing a multi-layer circuit board, the peripheral layer 62 could comprise a thin sheet of copper-clad laminate and the intermediate layer or layers 64 could comprise at least one intermediate circuit board with adhesive, such as prepreg, on either side thereof, as known to those skilled in the art.

Figure 3:
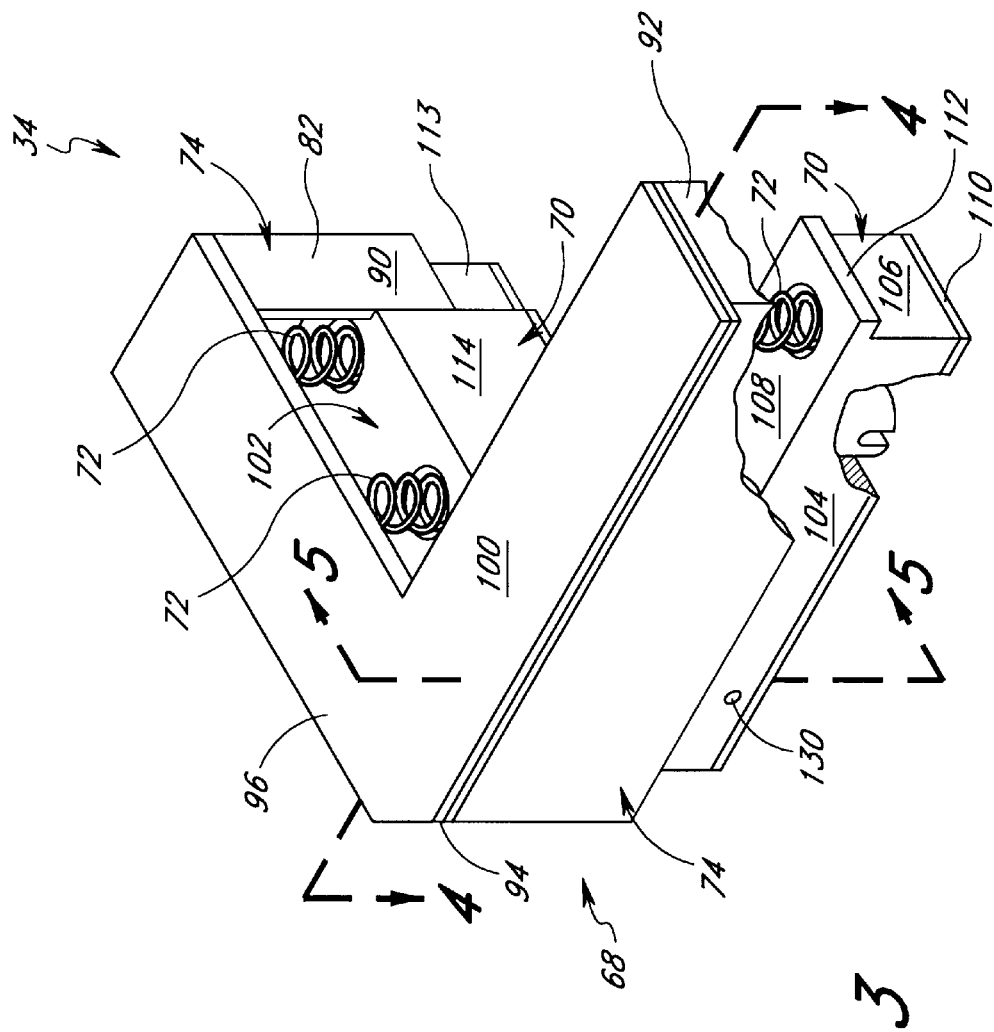
FIG. 3 is a perspective view of one embodiment of the stabilizer block of the present invention.
Figure 4:
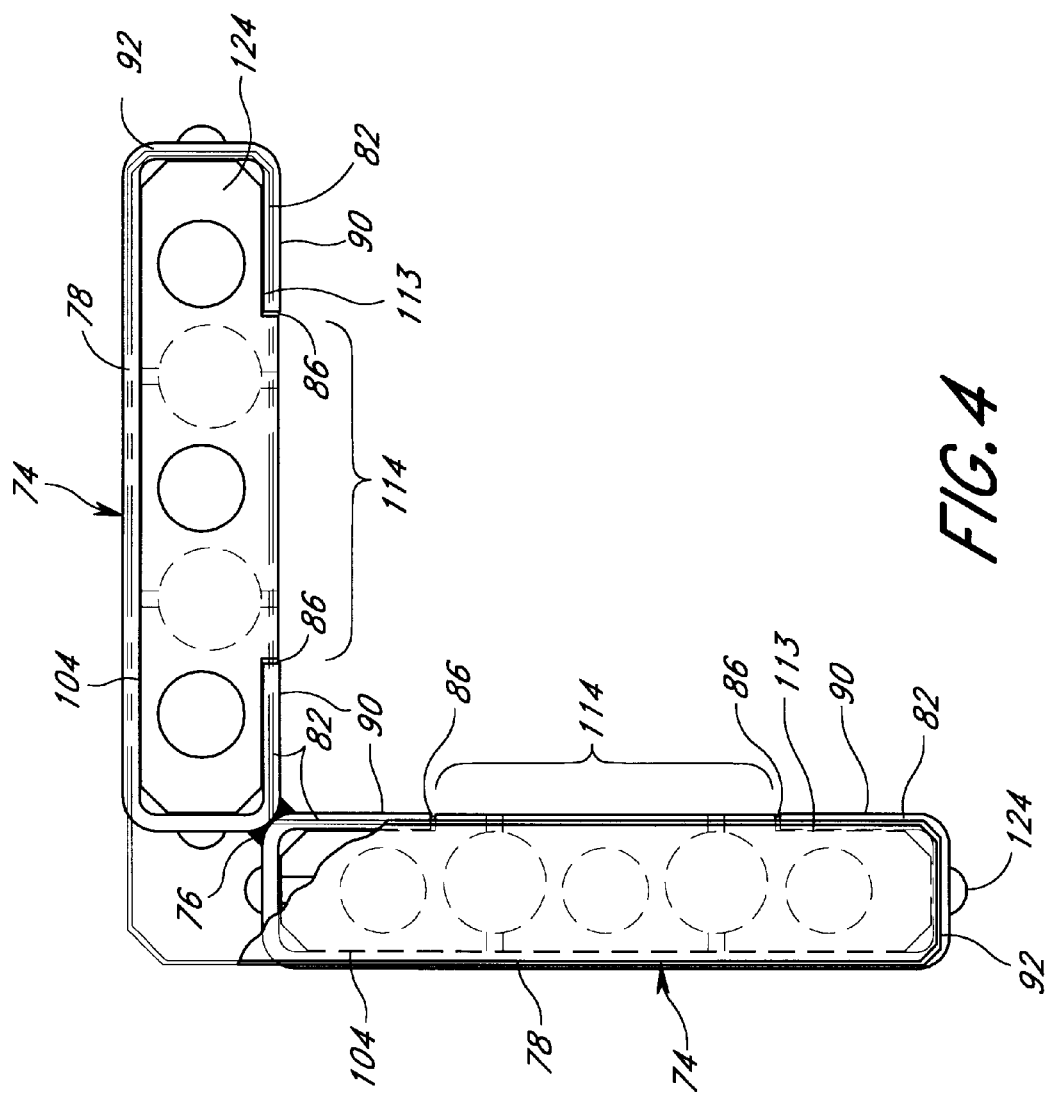
FIG. 4 is a cross-sectional top view of the stabilizer block of FIG. 3 taken along line 4—4 of FIG. 3.
Figure 5:
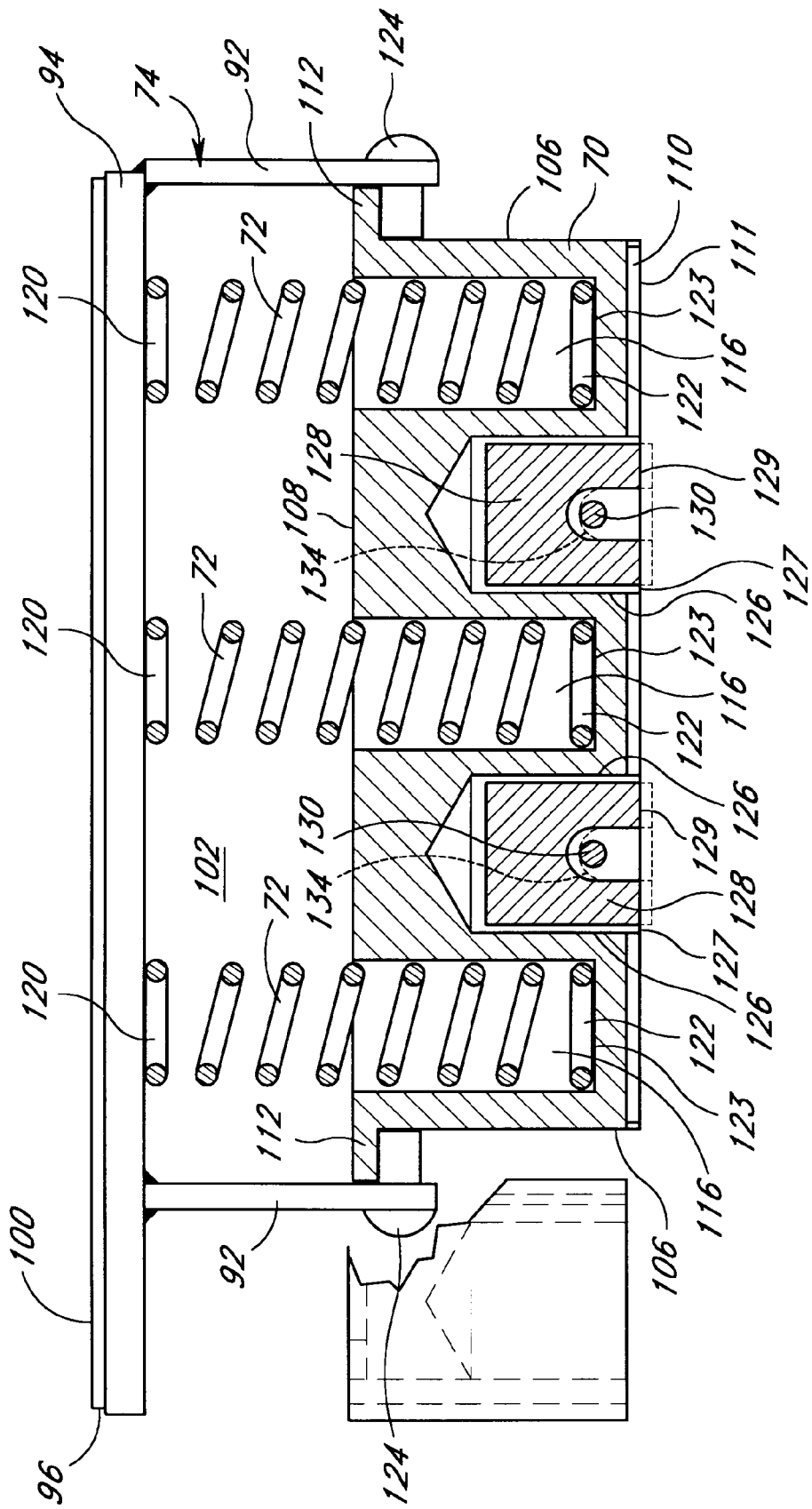
FIG. 5 is a cross-sectional side view of the stabilizer block of FIG. 3 taken along line 5—5 of FIG. 3.

FIG. 3 is a perspective view of the stabilizer block 34, which is best described in combination with FIGS. 4 and 5, which are cross-sectional top and side views, respectively. As best shown in FIG. 3, the illustrated embodiment of the stabilizer block 34 comprises an L-shaped structure that includes an outer housing 68 and a pair of slide members 70 that are slidably mounted within the outer housing 68. A plurality of biasing members, such as springs 72, are mounted between the outer housing 68 and the slide members 70 to bias the slide members 70 outward relative to the outer housing 68, as described more fully below.

With reference to FIGS. 3 and 4, the outer housing 68 comprises a pair of hollow, rectangular guide members 74 that are joined at a connection line 76 so as to be oriented orthogonal to one another. Each of the guide members 74 has an identical structure. Thus, a description of a single guide member 74 is equally applicable to both guide members 74. The L-shaped configuration of the stabilizer block 34 of this embodiment is selected so that the stabilizer block 34 can be positioned about the corners of the lamination book 52. Other configurations of the stabilizer block 34 can also be used.

With reference to FIGS. 3 and 4, each guide member 74 includes a flat outer side wall 78 and a pair of flat inner side walls 82 opposed to the outer side wall 78. The inner side walls 82 of each guide member 74 have opposed inner side wall edges 86 that define a gap therebetween. Additionally, each inner side wall 82 defines a planar abutment surface 90 of the guide member 34. A pair of end walls 92 are positioned at the ends of the inner side wall 82 and outer side wall 78 of each guide member 74 so as to connect the inner side walls 82 to the outer side walls 78.

As best shown in FIGS. 3 and 5, a flat, L-shaped top wall 94 is positioned atop the side and end walls 82 and 92 of the guide members 74. A flat top pad 96 defining a flat top surface 100 of the stabilizer block 34 is located on the top wall 94 and has a shape corresponding to the shape of the top wall 94. As will be described in greater detail below, the top pad 96 is adapted to engage with the upper platen 40 (FIG. 1) in a manner which reduces the likelihood of the stabilizer block 34 slipping from the desired position.

With reference to FIGS. 3–5, the outer side wall 78, the inner side wall 82, and the top wall 94 of each of the guide members 74 together define an internal cavity 102 in which the slide members 70 are slidably positioned. That is, a single slide member 70 is positioned within the internal cavity 102 of each of the guide members 74.

As shown in FIGS. 3–5, each slide member 70 generally comprises a rectangular block that defines an outer side surface 104 (FIG. 3) positioned parallel the outer side wall 78 of its respective guide member 74. Each slide member 70 also defines a pair of opposed end surfaces 106 that are positioned parallel and adjacent the end walls 92 of the respective guide member 74 in which it is mounted. Each slide member 70 also defines a flat slide member top surface 108 opposed to the top wall 94.

With reference to FIGS. 3 and 5, a bottom pad 110 is positioned on the bottom of each of the guide members 74. The shape of the bottom pads 110 substantially conform to the shape of the bottom surface of the guide members 74. Each bottom pad has a bottom surface 111 that defines the bottom surface of the stabilizer block 34. Desirably, both the top pad 96 and the bottom pad 110 are manufactured of heat resistant materials, such as kraft paper or aluminum, that is resistant to sliding and is also resistant to high temperatures. Additionally, the top pad 96 and the bottom pad 110 could also be textured or include scratches or abrasions that increase the friction of the pads 96 and 110 when positioned against a surface.

As best shown in FIGS. 3 and 5, a locking lip 112 is located at the upper edge of each of the end surfaces 106 of the slide members 70 so as to extend outward therefrom. The locking lips 112 extends outward toward the adjacent end walls 92 the outer housing 68. Each of the locking lips 112 is sized and positioned to interlock with the guide member end walls 92, as described more fully below.

Each slide member 70 also defines an inner side surface 113 opposed to the outer side surface 104. Each inner side surface 113 is positioned adjacent and parallel to the inner side walls 82 of the guide member 74. In each slide member 70, the portion of the inner side surface 113 positioned between the inner side edges 86 of the side walls 82 is raised to define an abutment surface 114 of the slide member 70. For each slide member 70, the abutment surface 114 is preferably positioned flush with the abutment surface 90 of the guide member 74 to define a smooth and continuous interface therebetween, as described more fully below. The abutment surfaces 114 of the slide members 70 and the abutment surfaces 90 of the guide members 74 are collectively referred to as the "stabilizer block abutment surfaces 115."

With reference to FIG. 5, a plurality of cylindrical spring bores 116 extend through the first slide member 70 in a direction substantially perpendicular to the plane of the top surface 100 of the stabilizer block 34. The spring bores 116 define a plurality of corresponding circular spring ports on the slide member 70 top surface. As mentioned above, a spring 72 is mounted within each of the spring bores 116 to provide a biasing force between the slide members 70 and the top wall 94 of the stabilizer block 34 so as to bias the outer housing 68 away from the slide member 70. Specifically, as shown in FIG. 5, each spring 74 has a top coil 120 and a bottom coil 122. The top coil 120 of each spring 74 abuts an interior surface of the outer housing top wall 94. The bottom coil 122 of each spring 74 abuts a bottom surface 123 of each spring bore 116. Preferably, the springs 72 are slightly compressed when mounted within the spring bores 116 so as to exert a force between the interior surface of the top wall 94 and the bottom surfaces 123 of the spring bores 116 and thereby bias the slide members 70 outward relative to the guide members 74.

As shown in FIG. 5, a locking member 124, such as a bolt, extends through each of the end walls 92 of the guide members 74 near the bottom edges of the end walls 92. The locking members 124 are sized and positioned to abut the bottom sides of the locking lips 112 and thereby act as a detent or stop to prevent the slide members 70 from sliding entirely out of the first guide members 74.

With reference to FIG. 5, a plurality of cylindrical magnet bores 126 extend through the slide members 70 and define a plurality of corresponding magnet ports 127 on the bottom surface 111 of the stabilizer block 34. A magnet 128 is positioned within each of the magnet bores 126. Each magnet 128 is cylindrically-shaped and has a magnet bottom surface 129 that is visible through the corresponding magnet port 127. Preferably, the magnet 128 is a high temperature magnet.

A pin 130 is mounted within a pin slot 134 that extends through each of the magnets 128 so as to extend across the pins slot 134. The end of each pin 130 is attached to the corresponding slide member 70 to couple the magnets 128 to the slide members 70 and thereby prevent the magnets 128 from falling out of the magnet bores 126. Specifically, the pins 130 secure the magnets 128 within the magnet bores 126 by abutting against the pins lots 134 in the magnets 128. The pins 130 are desirably positioned so that the if the magnets 128 are being supported by the pins 130, the bottom surfaces 129 protrude slightly out of the magnet bores 126, as shown in phantom in FIG. 5. Thus, the pins 130 allow the magnets 128 to freely float within the magnet bores 126 so that the magnet bottom surfaces 129 are freely movable in and out of the magnet ports 127. Preferably, the height of each magnet 130 is less than the height of the magnet bore 126 in which it is positioned. Thus, the magnets 128 may be pushed entirely into the magnet bores 126 so that the magnet bottom surfaces 129 do not protrude out of the magnet ports 127, as shown in solid lines in FIG. 5.

Figure 6A:
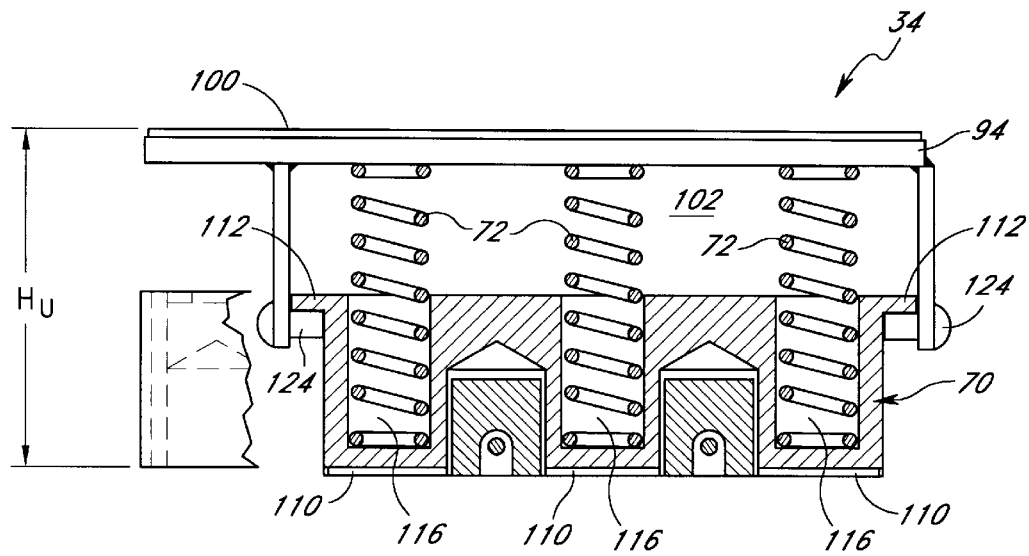
FIGS. 6A–6C illustrate the stabilizer block of FIG. 3 moving from an uncompressed state to a compressed state.
Figure 6B:
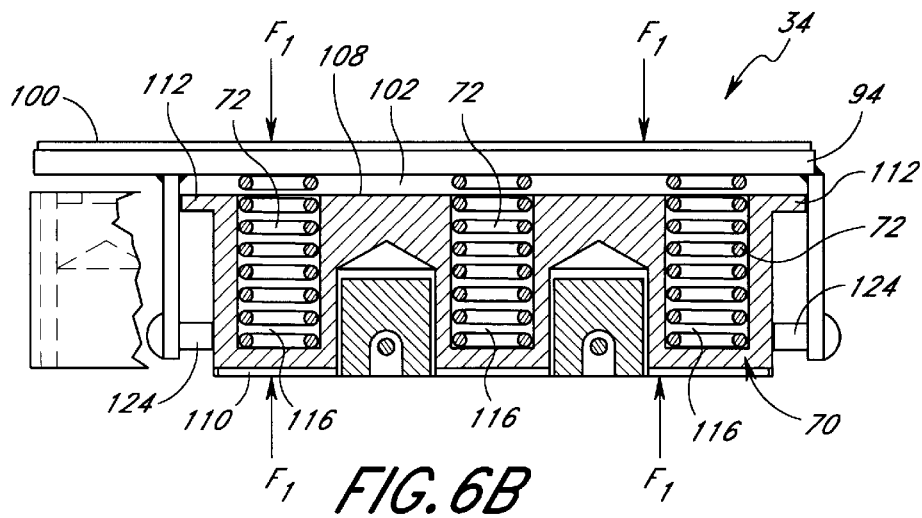
Figure 6C:
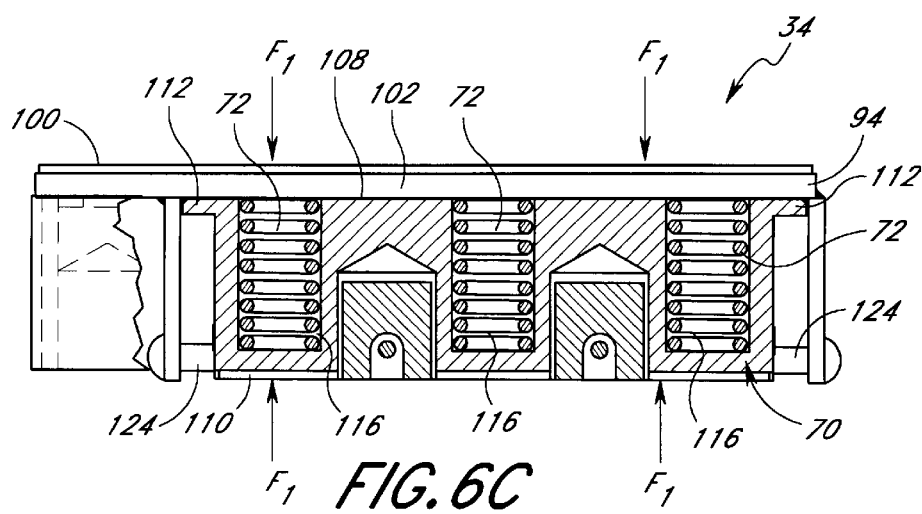

With reference to FIGS. 6A–C, the stabilizer block 34 is configured to move between an uncompressed state and a compressed state. FIG. 6 shows the stabilizer block 34 in the uncompressed state wherein the springs 72 exert an unopposed force between the bottom surfaces 123 of the spring bores 116 and the interior surface of the top wall 94. The spring force pushes the slide member 70 outward relative to the internal cavity 102 of the guide member 74. As mentioned, the locking members 124 and locking lips 112 abut one another and act as a detent to prevent the slide members 70 from sliding entirely out of the guide members 74. The uncompressed state is the default state of the stabilizer block 34 wherein no external forces are being applied to the stabilizer block 34.

With reference to FIG. 6A, the stabilizer block 34 has a maximum or uncompressed height $H_U$ when in the uncompressed state. As used herein, the "height" of the stabilizer block 34 is the distance between the top surface 100 of the stabilizer block 34 and the bottom of the bottom pad 110. Preferably, the uncompressed height $H_U$ of the stabilizer block 34 is greater than the un-laminated height $H_{BU}$ (FIG. 2) of the lamination book 52.

FIG. 6B shows the stabilizer block 34 being moved to the compressed state by applying a force $F_1$ to the top and bottom surfaces 98, 111 of the stabilizer block 34. The force $F_1$, should be sufficient to compress the springs 72 so that the slide members 70 slidably moves into the interior cavities 102 of the guide members 74. As the slide members 70 move in this manner, the slide member top surfaces 108 move toward the top wall 94. The slide members 70 continue to slide into the guide members 74 until the slide member top surfaces 108 abut the top wall 94 of the outer housing 68, as shown in Figure 5C, at which point the stabilizer block 34 is in the totally compressed state.

As shown in FIG. 6C, the stabilizer block 34 has a minimum or compressed height $H_C$ when in the compressed state. Additionally, the compressed height $H_C$ is preferably less than or equal to the laminated height $H_{BL}$ of the lamination book 52 so as to allow the compressive forces of the lamination press 30 to be transmitted to the lamination book 52, as described in more detail below.

Figure 7:
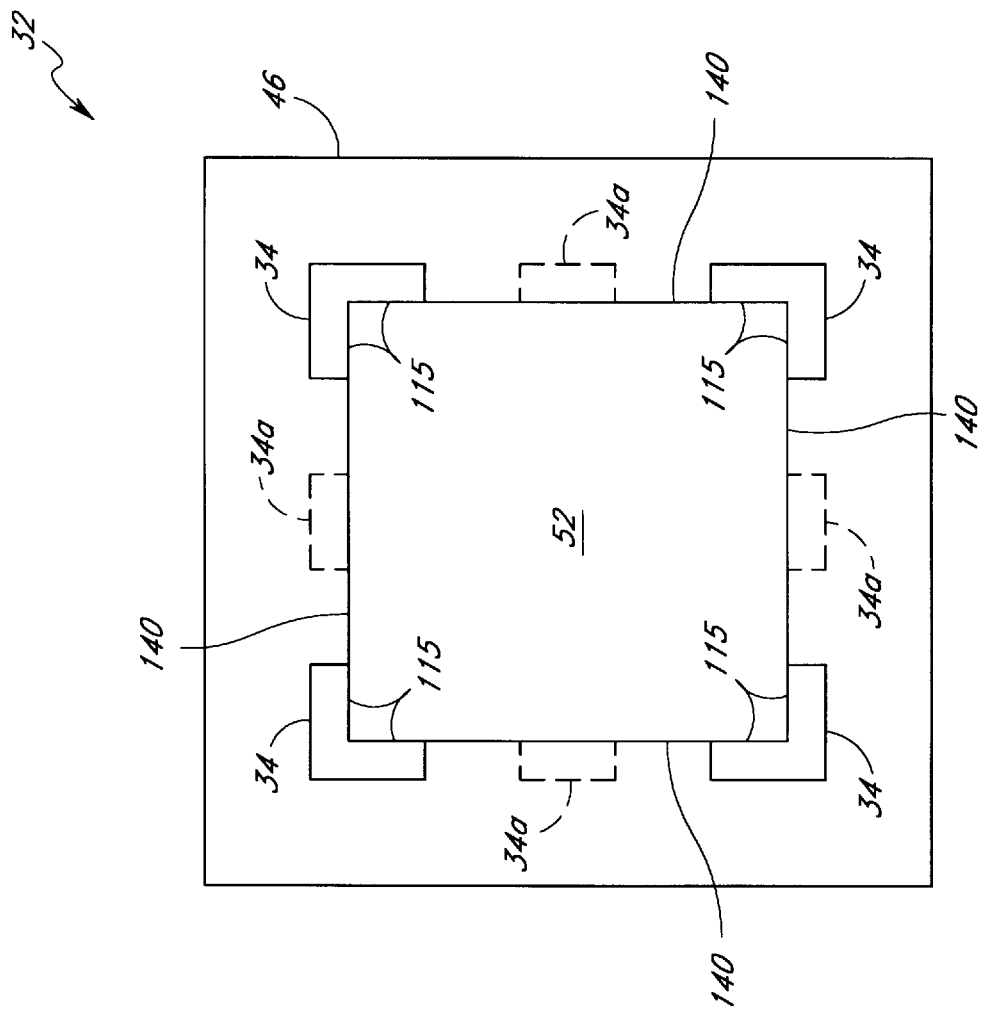
FIG. 7 is a top plan view of the circuit board lamination assembly of FIG. 1.

FIG. 7 is a top plan view of the circuit board lamination assembly 32. The circuit board lamination assembly 32 is formed by placing the lamination book 52 at any location on the support surface 50 of the carrier tray 46. The edges of the lamination book 52 define an outer perimeter 140. The stabilizer blocks 34 are then positioned around the four corners of the lamination book 52 with the bottom pads 110 (FIG. 5) of the stabilizer blocks 34 resting directly on the support surface 50. Desirably, the stabilizer block abutment surfaces 115 are positioned substantially flush against the sides of the lamination book 52. Alternatively, the abutment surfaces 115 may be spaced from the outer perimeter 140 of the lamination book 52. Each of the abutment surfaces 114 of the stabilizer blocks 34 desirably defines a boundary or border. Preferably, the stabilizer blocks 34 inhibit the perimeter 140 of the lamination book 52 from moving across the border defined by the abutment surfaces 114 of the stabilizer blocks 34.

Advantageously, a magnetic force between the stabilizer block magnets 128 and the carrier tray 46 inhibits the stabilizer blocks 34 from moving relative to the carrier tray 46. Additionally, the high friction material of the stabilizer block 34 bottom pads 110 provides a friction force between the bottom pads 110 and the carrier tray support surface 50 to further inhibit movement of the stabilizer blocks 34 relative to carrier tray 46. The friction forces increase as the platens 36, 40 compress the stabilizer blocks 34. With the stabilizer blocks 34 secured in this manner, the likelihood of the lamination book 52 moving during the pressing process is substantially reduced.

As shown in FIG. 7, the stabilizer blocks 34 do not necessarily have to be located only at the corners of the lamination book 52. One or more straight stabilizer blocks 34a (shown in phantom) could also be positioned around the sides of the lamination book 52 to provide additional security against movement. For example, a single slide member 70 could be used and a single guide member 74 could be used to manufacture the straight stabilizer block 34a. It will be appreciated that the size and shape of the stabilizer blocks 34 could be varied to conform to lamination books of various sizes and shapes.

Figure 8A:
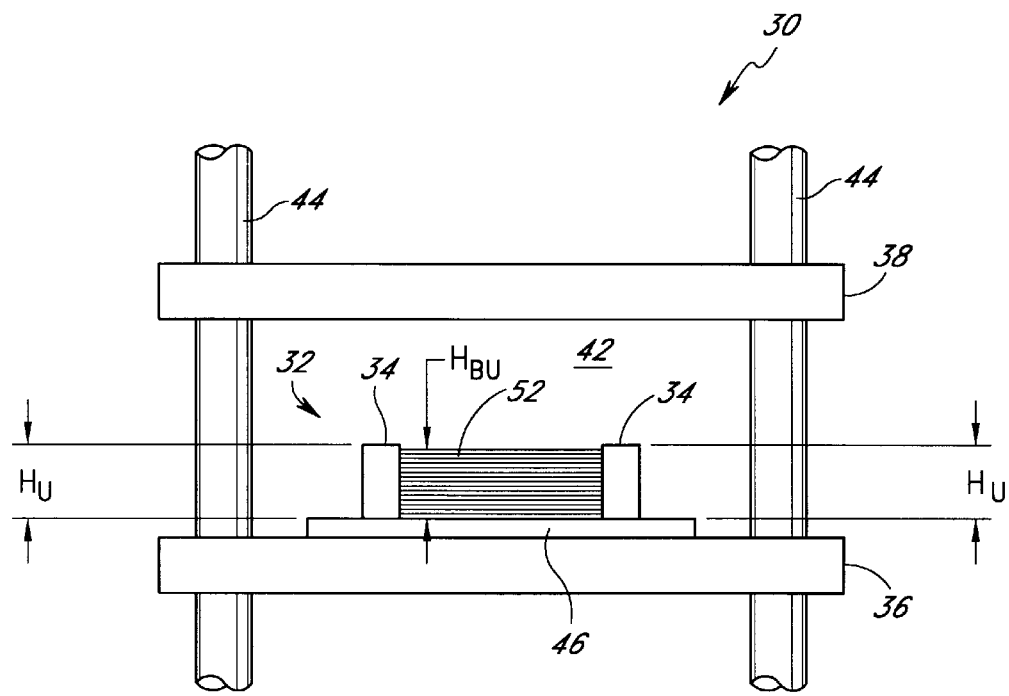
FIGS. 8A–8B are cross-sectional views of the stabilizer blocks of FIG. 3 which illustrate the lamination process of the present invention.
Figure 8B:
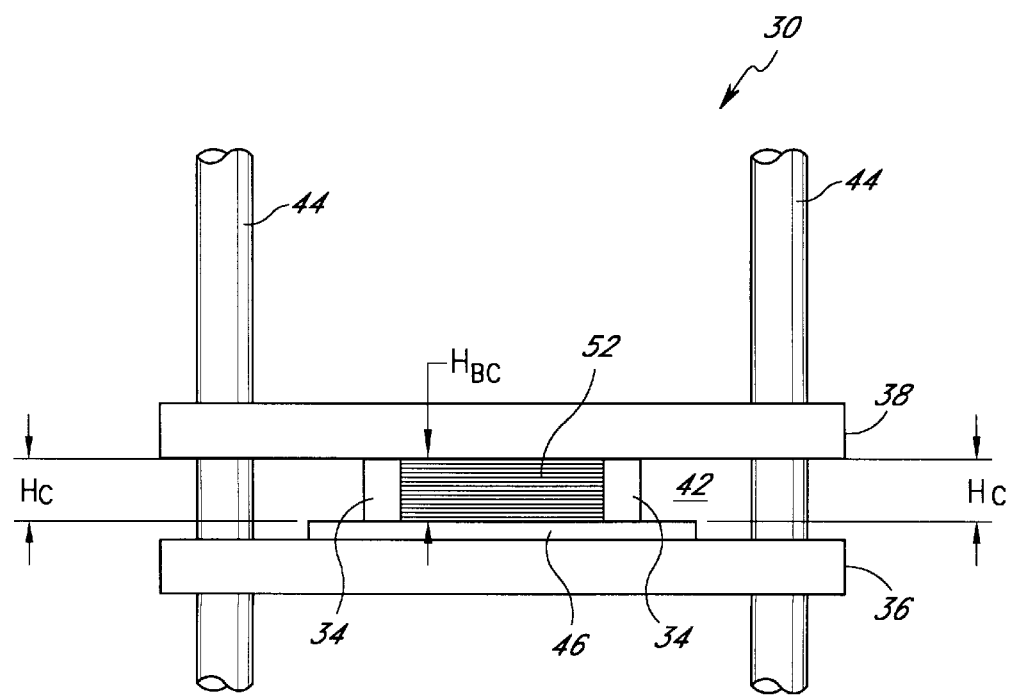

FIGS. 8A and 8B schematically illustrate the lamination process used with the stabilizer blocks 34 of the present invention. The lamination assembly 32 is preferably formed by stacking the layers of the lamination material discussed in reference to FIG. 2 on the carrier tray 46 in a desired order. Subsequently, the stabilizer blocks 34 are positioned on the carrier tray 46 in an orientation wherein the stabilizer block abutment surfaces 115 arc positioned adjacent the edge of the lamination book 52 so as to retain each of layers of the lamination books 52 in a fixed orientation with respect to one another.

The circuit board lamination assembly 32 is then positioned within the lamination space 42 of the lamination press 30. Specifically, the carrier tray 46 is positioned on top of the first platen 36. As shown, at this step the stabilizer blocks 34 are in the uncompressed state and thus have an uncompressed height $H_U$. As mentioned, prior to lamination, the lamination book 52 has an un-laminated height $H_{BU}$ which is preferably less than the uncompressed height $H_U$, of the stabilizer blocks 34. Advantageously, the height difference between the lamination book 52 and the stabilizer blocks 34 greatly reduces the likelihood of the top-most caul 56 (FIG. 2) in the lamination book 52 moving over the top of the stabilizer blocks 34 and getting caught between the stabilizer blocks 34 and the second platen 40 during the pressing process.

The first and second platens 36, 40 are then heated and moved toward each other along the pistons 44 to compress the circuit board lamination assembly 32 therebetween in a well known manner, as shown in FIG. 8B. The combination of heat and pressure causes the prepreg layers in the lamination book 52 to melt. The first and second platen 36, 40 thereby compress the lamination book 52 to the laminated height $H_{BU}$. The force applied by the first and second platens 36, 40 also compresses the stabilizer blocks 34 so that the stabilizer blocks 34 move to the reduced compressed height $H_C$, as described above with respect to FIGS. 5A–5C. Desirably, the stabilizer blocks 34 are capable of being compressed to a compressed height $H_C$ that is less than or equal to the laminated height $H_L$ of the lamination book 52. In this manner, the stabilizer block 34 allows the lamination book 52 to be fully compressed.

The abutment surfaces 114 of the slide members 70 and the abutment surfaces 90 of the guide members 74 together provide a continuously planar stabilizer block abutment surface 115 across the entire range of compression of the stabilizer block 34. When the stabilizer block 34 is fully extended, the planar abutment surfaces 90 of the guide members 74 prevents the uppermost layers in the lamination book 52 from moving laterally beyond the boundary defined by the stabilizer block 34. As the stabilizer block 34 is compressed, the abutment surfaces 90 of the guide members 74 also compresses so that the stabilizer block abutment surface 115 remains planar across the entire range of compression.

As mentioned, the stabilizer blocks 34 act as walls around the lamination book 52 to advantageously prevent the layers of the lamination book 52 from undesirably shifting or moving as the platens 36, 40 are applying pressure. During the compression process each of the layers comprising the lamination book 52 are retained in a fixed lateral orientation or position with respect to each other by the abutment surfaces 115 of the stabilizer blocks 54. Moreover, the magnets 130 retain the stabilizer blocks 34 in their positions so as to retain the layers of the lamination book 52 in the fixed lateral position.

Further, as the platens 36 and 40 are moved towards each other so as to compress the stabilizer blocks 54, the force that is exerted on the stabilizer blocks 54 is normal to the plane of the upper top pad 96 and the bottom pad bottom pad 110 of the stabilizer blocks 54. It will be appreciated that this normal force increases the frictional force that is exerted on the stabilizer blocks 54 to retain the stabilizer blocks 54 in their desired positions on the carrier tray 46. Hence, while individual layers maybe urged to move laterally by the force of the platens 36 and 40, this same force is simultaneously increasing the frictional force that is retaining the stabilizer blocks 54 in their desired positions where the stabilizer blocks 54 are reducing lateral movement of the layers so as to retain the book 52 in its desired form.

Additionally, as discussed above, the magnets 128 are sized to be pushed entirely into the magnet bores 126 so that the bottom ends of the magnets 128 do not protrude from the bottom surface 111 of the stabilizer blocks 34. If the magnets 128 did protrude, they would undesirably create areas of localized pressure that would interfere with the pressing of the lamination book 52. As also mentioned above, the abutment surface 115 of each of the stabilizer blocks 34 is desirably smooth so as to prevent the edges of the lamination book 52 from catching in any nonuniformities in the abutment surface 115 during the lamination process.

After pressure and heat have been applied to the circuit board lamination assembly 32 for a predetermined amount of time, the first and second platens 36, 40 are moved away from one another. The lamination book 52 is then allowed to cool and cure to produce a laminated structure, such as a multi-layer circuit board or a copper-clad laminate.

It has been observed that the top pad 96 (FIG. 5) of the stabilizer block 34 may sometimes stick to the top platen 40 after the pressure is removed and the platens 36 and 40 are moved away from one another. FIG. 9 is a top view of a preferred embodiment of the top pad 96 having a configuration that reduces the likelihood of the top pad 96 sticking to the top platen 40. As shown, the top pad 96 is comprised of a thin, flat, L-shaped pad member 131 that is preferably manufactured of a material, such as copper, aluminum, bronze or a high temperature plastic, that has a reduced tendency to stick to the top platen 40 during the pressing process. A plurality of apertures 132 extend through the pad member 131. The apertures 132 are filled with a high friction material that inhibits the top pad 96 from sliding on the top platen. The high friction material thus reduces the likelihood that the stabilizer block 34 will slip or slide during the lamination process. Advantageously, because the high friction material only extends over localized portions of the top pad 96, the likelihood of the top pad 96 sticking to the top platen is greatly reduced. It will be appreciated that the shape of the top pad 96 may be varied to conform to the shape of the particular stabilizer block 34 being used.

The stabilizer block 34 is thus used to stabilize the position of a lamination book 52 during lamination in a press. The stabilizer block 34 is advantageously configured to compress in height so as not to interfere with the pressure being applied to the lamination book 52 by the platens 36, 40 of the lamination press 30. Moreover, the stabilizer blocks 34 does not require pins or other external means to secure the position of the stabilizer block 34 on a carrier tray 46, as the stabilizer blocks 34 uses magnets 128 and a friction pad. This allows the stabilizer block 34 to be quickly and easily mounted at any location on a carrier tray 46 and to be used with lamination books of various sizes.

Although the preferred embodiment of the present invention has shown, described, and pointed out the fundamental novel features of the invention as applied to these embodiments, it will be understood that various omissions, substitutions, and changes in the form of the detail of the device illustrated, may be made by those skilled in the art without departing from the spirit of the present invention. Consequently, the scope of the invention should not be limited to the foregoing discussion, but is to be defined by the claims which follow.

What is claimed is:

1. A method of manufacturing a laminated structure, comprising:

forming a lamination book by stacking a plurality of layers of laminar material atop one another, the peripheral edges of at least one of the laminar layers defining a perimeter of the book;

placing the book on a first planar surface;

positioning at least one stabilizer block on the first planar surface so that an abutment surface of the stabilizer block defines a boundary line positioned adjacent at least a portion of the perimeter of the book, wherein the stabilizer block has a height that is greater than the height of the lamination book;

stabilizing the position of the stabilizer block relative to the first planar surface by using a magnet to couple a bottom surface of the stabilizer block to the first planar surface;

compressing the book between the first planar surface and a second planar surface so that the stabilizer block compresses in height wherein the abutment surface of the stabilizer block prohibits the adjacent portion of the perimeter of the lamination book from moving across the boundary defined by the abutment surface.

2. The method of claim 1, wherein placing the book on a first planar surface comprises placing the book on a bottom platen of a press.

3. The method of claim 1, wherein placing the book on a first planar surface comprises placing the book on a carrier tray and placing the carrier tray on the bottom platen of a press.

4. The method of claim 1, wherein positioning at least one stabilizer block on the first planar surface comprises positioning the abutment surface of the stabilizer block so that the abutment surface contacts an edge of the lamination book such that the boundary line define by the abutment surface and at least a portion of the perimeter of the lamination book are substantially aligned.

5. The method of claim 1, additionally comprising positioning a plurality of stabilizer blocks on the first planar surface so that abutment surfaces of the stabilizer blocks collectively define a boundary line that surrounds the perimeter of the lamination book.

6. A stabilizer block for stabilizing the position of a laminar stack having a plurality of layers positioned on top of each other in a desired lateral orientation, the stack being positioned on a support surface between a pair of platens of a lamination press so that the stack can be compressed into a laminar structure, comprising:

a first member;

a second member coupled to the first member so that the first and second members are movable with respect to one another in a first direction between a first and a second position so that the stabilizer block compresses in height in response to a force being applied to the stabilizer block along the first direction;

a biasing member coupled to the first member and the second member so as to urge the first member and the second member away from each other;

an abutment surface defined by the first member and the second member, the abutment surface being substantially planar so as to be positioned adjacent an edge of the laminar stack;

wherein the abutment surface has a first height greater than the height of the laminar stack when the first and second members are in the first position and wherein the abutment surface has a second height which is less than the height of the laminar stack, while still remaining substantially planar, when the first and second members are in the second position so that the laminar stack can be compressed by the platens of the laminar press while the abutment surface is in contact with the layers of the laminar stack so as to retain the layers in the desired lateral orientation during compression of the stack.

7. The stabilizer block of claim 6, additionally comprising a magnet coupled to a bottom surface of the second member, the magnet configured to provide a magnetic force between the stabilizer block and the support surface when the stabilizer block is positioned on the support surface to inhibit the stabilizer block from moving relative to the support surface.

8. The stabilizer block of claim 7, wherein the magnet is movably mounted with the second member so that a bottom edge of the magnet is movable across a plane defined by the bottom surface of the second member.

9. The stabilizer block of claim 6, wherein the first member defines a top surface of the stabilizer block, and wherein the top surface at least partially comprises a high friction material.

10. The stabilizer block of claim 9, wherein the top surface is textured.

11. The stabilizer block of claim 9, wherein the second member defines a bottom surface of the stabilizer block, and wherein the bottom surface at least partially comprises a high friction material.

12. The stabilizer block of claim 11, wherein the bottom surface is textured.

13. The stabilizer block of claim 6, wherein the biasing member is a spring.

14. The stabilizer block of claim 6, wherein the abutment surface is dimensioned to be positioned along a corner of the object.

15. The stabilizer block of claim 6, wherein the first member comprises a housing defining a cavity, and wherein the second member comprises a block slidably mounted within the cavity.

16. The stabilizer block of claim 6, additionally comprising a pad mounted on the top surface of the stabilizer block.

17. The stabilizer block of claim 16, wherein a plurality of apertures extend through the pad, and wherein the apertures are filled with a high friction material.

* * * * *